US008892933B2

(12) United States Patent
Getzin et al.

(10) Patent No.: US 8,892,933 B2
(45) Date of Patent: Nov. 18, 2014

(54) SYNCHRONIZATION OF MULTIPLE SIGNAL CONVERTERS BY TRANSMITTING SIGNAL CONVERSION DATA AND RECEIVING UNIQUE CORRECTION VALUES FOR THE RESPECTIVE COUNTERS THROUGH THE SAME DATA INTERFACE PINS

(75) Inventors: Lawrence Getzin, Concord, NH (US); Petre Minciunescu, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 214 days.

(21) Appl. No.: 13/453,401

(22) Filed: Apr. 23, 2012

(65) Prior Publication Data

US 2013/0278312 A1    Oct. 24, 2013

(51) Int. Cl.
G06F 1/12     (2006.01)
G06F 13/42    (2006.01)
H04L 5/00     (2006.01)
H04L 7/00     (2006.01)

(52) U.S. Cl.
CPC .................................. G06F 1/12 (2013.01)
USPC ........................................................ 713/400

(58) Field of Classification Search
CPC ....................................................... G06F 1/12
See application file for complete search history.

(56) References Cited

U.S. PATENT DOCUMENTS

| | | | | | |
|---|---|---|---|---|---|
| 5,384,906 | A | * | 1/1995 | Horst | 713/375 |
| 6,199,169 | B1 | * | 3/2001 | Voth | 713/400 |
| 6,308,280 | B1 | * | 10/2001 | Joseph et al. | 713/400 |
| 6,611,922 | B2 | * | 8/2003 | Ozcetin et al. | 713/400 |
| 6,950,956 | B2 | * | 9/2005 | Zerbe et al. | 713/400 |
| 7,251,748 | B2 | * | 7/2007 | Liberty et al. | 714/20 |
| 8,086,761 | B2 | * | 12/2011 | Huang et al. | 710/10 |
| 2010/0058095 | A1 | * | 3/2010 | Malek | 713/375 |
| 2011/0099410 | A1 | * | 4/2011 | Yin et al. | 713/503 |
| 2013/0227181 | A1 | * | 8/2013 | Martin et al. | 710/58 |

* cited by examiner

Primary Examiner — Thomas Lee
Assistant Examiner — Gayathri Sampath
(74) Attorney, Agent, or Firm — Kenyon & Kenyon LLP (57) ABSTRACT

The present invention may provide a system including a controller and a plurality of integrated circuits. The controller may control synchronization operations of the system, the controller may include a master timing counter and a controller data interface. Each integrated circuit may include a timing counter and an IC data interface. Further, each integrated circuit may synchronize its respective timing counter based on synchronization command received from the controller via the data interfaces. Hence, the system may provide synchronization between the controller and the integrated circuits without an extraneous designated pin(s) for a designated common time-based signal.

15 Claims, 11 Drawing Sheets

SYNCHRONIZATION OF MULTIPLE SIGNAL CONVERTERS BY TRANSMITTING SIGNAL CONVERSION DATA AND RECEIVING UNIQUE CORRECTION VALUES FOR THE RESPECTIVE COUNTERS THROUGH THE SAME DATA INTERFACE PINS

BACKGROUND

The present invention relates to synchronization of multiple integrated circuits, which may be signal converters such as analog-to digital converts (ADCs) or digital-to-analog converters (DACs).

Oftentimes, multiple signal converters are provided in parallel in an electrical system. To operate efficiently, the signal converters must be synchronized. In some applications, however, such as poly-phase measurement systems, multiple signal converters (e.g., ADCs) are placed in different multiple integrated circuits because of the isolation needed between the sampling side and the control side. The two sides typically operate at two different voltage levels. The integrated circuits, therefore, contain an isolation barrier for the two different voltage levels. However, since the ADCs are on discrete integrated circuits, synchronization between the ADCs becomes problematic.

One conventional solution is to add a designated pin on each integrated circuit for synchronization purposes. In this solution, a common time-based signal is provided from a sync master to all slave integrated circuits via the designated synchronization pin. This solution, though, has serious drawbacks. For one, the designated synchronization pin is an extraneous pin that takes up valuable circuit space, which typically is at a premium due to trends toward integrated circuit size reduction. Furthermore, since the pin is common to all integrated circuits, it is subject to interference. The interference can generate glitches causing inaccurate results.

Therefore, the inventors recognized a need in the art for multiple integrated circuit synchronization with a common clock but without a designated common time-based signal, and corresponding designated pin(s), between the sync master and slave integrated circuits.

DETAILED DESCRIPTION

Embodiments of the present invention may provide a system including a controller and a plurality of integrated circuits. The controller may control synchronization operations of the system, the controller may include a master timing counter and a controller data interface. Each integrated circuit may include a timing counter and an IC data interface. Further, each integrated circuit may synchronize its respective timing counter based on synchronization command received from the controller via the data interfaces. Hence, the system may provide synchronization between the controller and the integrated circuits without an extraneous designated pin(s) for a designated common time-based signal.

Figure 1:
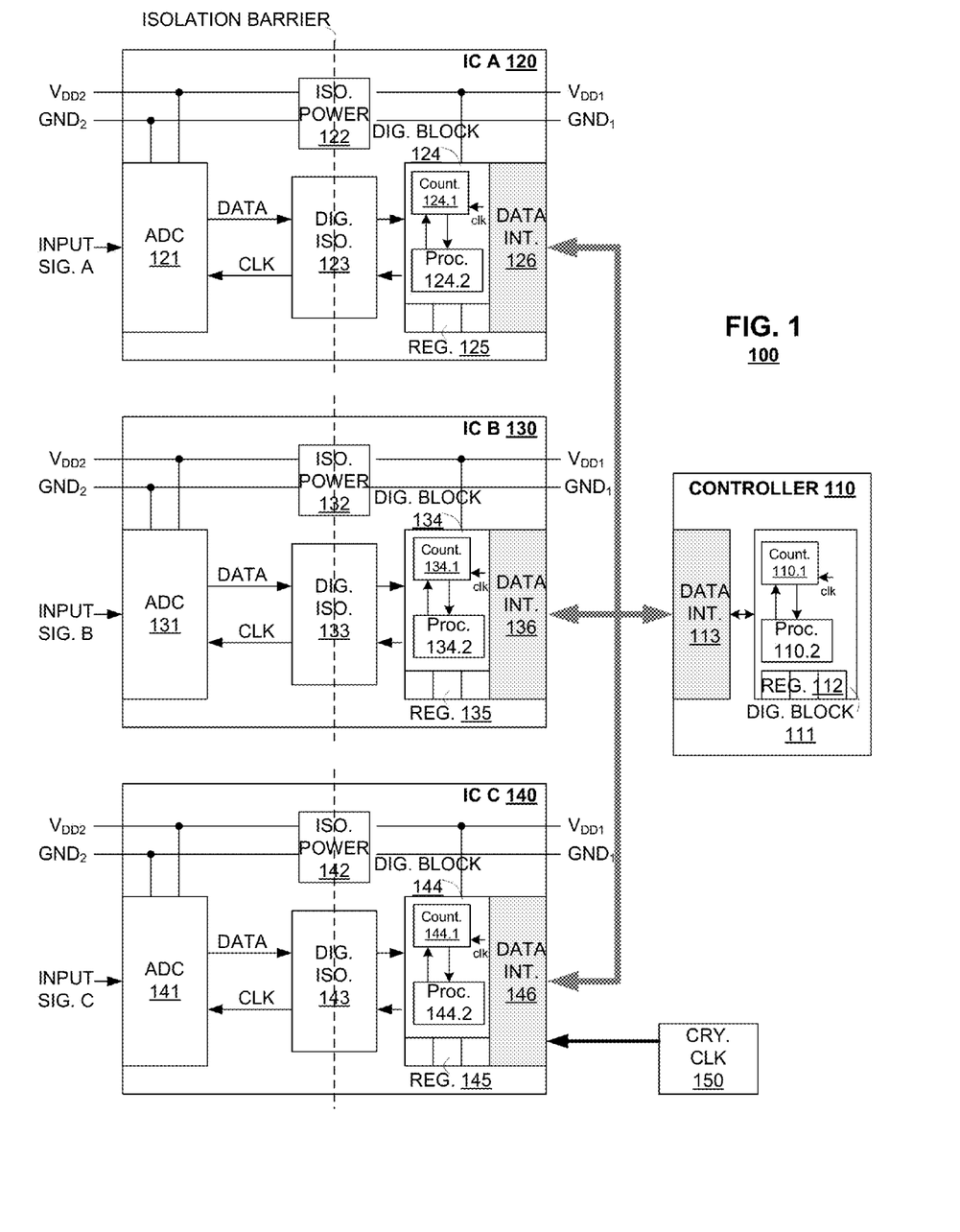
FIG. 1 is a simplified block diagram of a synchronization system according to an embodiment of the present invention.

FIG. 1 is a simplified block diagram of a synchronization system 100 according to an embodiment of the present invention. The system 100 may include a controller 110, a plurality of integrated circuits (ICs) 120, 130, 140, and a crystal clock 150. The ICs 120, 130, 140 may include signal converters, for example, to convert response input signals into digital values. Although the system 100 shows three ICs 120, 130, 140 for illustration purposes, the system 100 can be expanded to include any number of ICs.

The controller 110 may operate as a master unit for synchronization purposes to the ICs 120, 130, 140, which may operate as corresponding slave units. The controller 110 may include a digital block 111, which may include a master-timebase counter 111.1, a processor 111.2, and various other digital components (not shown) to provide controller 110 operations. The master_timebase counter 111.1 may be employed in synchronization operations as will be further described below. The digital block 111 may also include registers 112. The registers 112 may include registers to store snap register value(s), master_timebase value(s), correction Δ value(s), sample value(s), etc., as will be further described below. The controller 110 may also include a data interface 113 to communicate to the ICs 120, 130, 140. The data interface 113 may be provided as a serial peripheral interface (SPI). The data interface 113 may facilitate bi-directional communication with the ICs 120, 130, 140.

The ICs 120, 130, 140 may be provided as signal converters. In system 100, the ICs 120, 130, 140 are illustrated as ADCs; however, the ICs 120, 130, 140 may be provided as other signal converters such as DACs. In an embodiment, each IC 120, 130, 140 may be provided on a discrete chip with an isolation barrier separation, a converter circuit (ADC) 121, 131, 141 from other components. For example, IC A 120 may operate on different supply voltages, VDD1 and VDD2, and grounds, GND1 and GND2, on each side of the isolation barrier. Hence, the isolation barrier may separate the circuit components based on their supply voltages. The IC A 120 may include an ADC 121, an isolation power circuit 122, a digital isolation circuit 123, a digital block 124 with registers 125, and a data interface 126. Here, the first supply voltage VDD1 may power components on a first side of the isolation barrier (e.g., digital block 124), and the second power supply voltage VDD2 may power components on a second side of the isolation barrier (e.g., ADC 121). Each side may also include its own respective GND. The isolated power circuit 122 may provide isolation and separation of the power supply signals.

The ADC 121 may receive an analog input signal A and may digitize the analog input signal A generating a corresponding digital signal. The ADC 121 may provide the digital signal to the digital block 124 via the digital isolation circuit 123. The digital block 124 may provide a clock signal to the ADC 121 for its operation via the digital isolation circuit 123. In an embodiment, the ADC 121 may be provided as a sigma delta converter. For example, the ADC 121 may be provided as a multiple channel (say, three) sigma delta converter. Alternatively, the ADC 121 may provided as other types of ADCs such as successive approximation register (SAR) converters.

The digital block 124 may include a timebase counter 124.1, a processor 124.2, and various other digital components (not shown) to provide IC A 120 operations. For example, the digital block 124 may also include transmitter/receiver components for transmission to and from the digital isolation circuit 123. The timebase counter 124.1 may be employed in synchronization operations as will be further described below. The digital block 124 may also include registers 125. The registers 112 may include registers to store timebase value(s), snap register value(s), correction Δ value(s), sample value(s), etc., as will be further described below. The IC A 120 may also include the data interface 126 to communicate to with the controller 110 and with the other ICs 130, 140. The data interface 126 may be provided as a serial peripheral interface (SPI). The data interface 126 may facilitate bi-directional communication.

ICs B and C 130, 140 may be provided in a similar fashion as IC A 120 discussed above. However, one IC (say, IC C 140), may be additionally coupled to a crystal clock 150 via its data interface 146. The crystal clock 150 may be provided a crystal oscillator operating at a predetermined frequency. For example, the crystal clock may be a 4.096 MHz crystal clock. IC C 140 may provide the crystal clock signal to the other ICs (IC A 120 and IC B 130) via their respective data interfaces. Alternatively, the crystal clock 150 may be coupled to the controller 110, and the controller 110 may provide the crystal clock signal to the ICs 120, 130, 140.

Figure 2A:
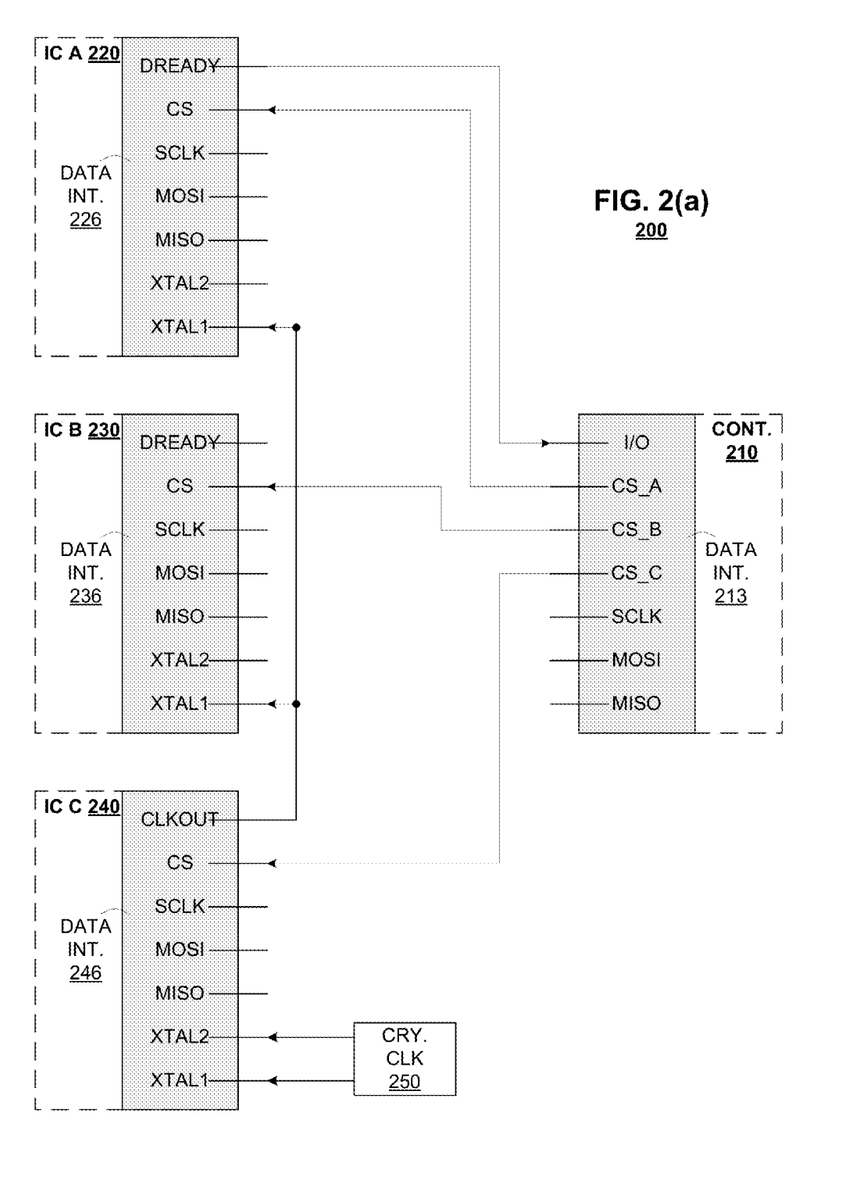
FIGS. 2(a)-(d) are a simplified block diagrams of data interface layouts according to an embodiment of the present invention.
Figure 2B:
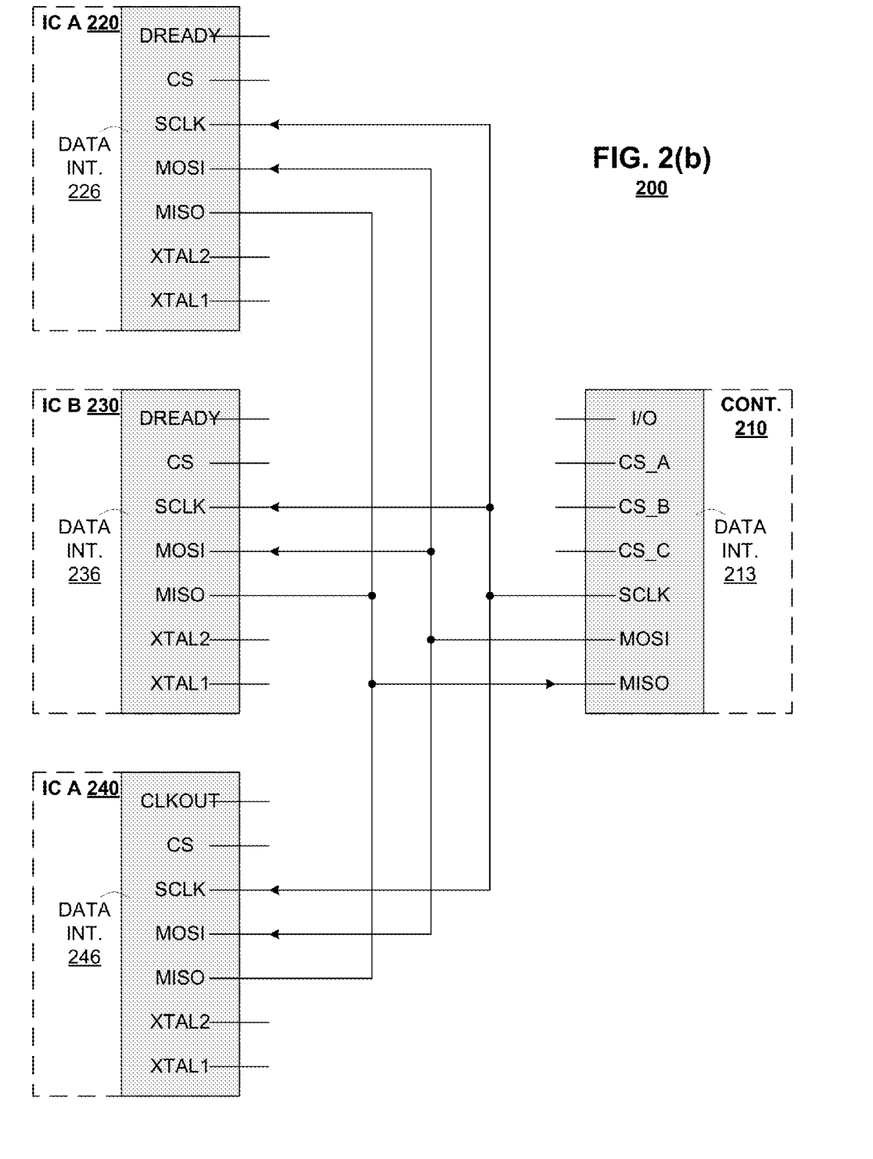

FIGS. 2(a) and 2(b) show a simplified block diagram of data interface layouts of electrical system 200 according to an embodiment of the present invention. The electrical system 200 may include a controller 210 with data interface 213, a plurality of ICs 220, 230, 240 with respective data interfaces 226, 236, 246, and a crystal clock 250. Each IC interface 226, 236, 256 may include a DREADY/CLKOUT pin, a CS pin, a SCLK pin, a MOSI pin, a MISO pin, and XTAL1, XTAL2 pins. Each data interface 226, 236, 256 may also include a GND pin (not shown). The controller data interface 213 may include I/O pin, a CS_A pin, CS_B pin, CS_C pin, a SCLK pin, a MOSI pin, and a MISO pin.

Referring to FIG. 2(a), the CS pins may be chip select pins. Thus, each IC CS pin may be coupled to a corresponding CS pin on the controller data interface 213 (e.g., CS_A pin coupled to CS pin on IC A). The controller 210 may select which IC(s) it wants to communicate with based on the value on the corresponding CS pins. For example, the CS pin to a target IC may be pulled low by the controller 210, when the controller 210 wants to transmit a signal to that target IC.

Figure 2C:
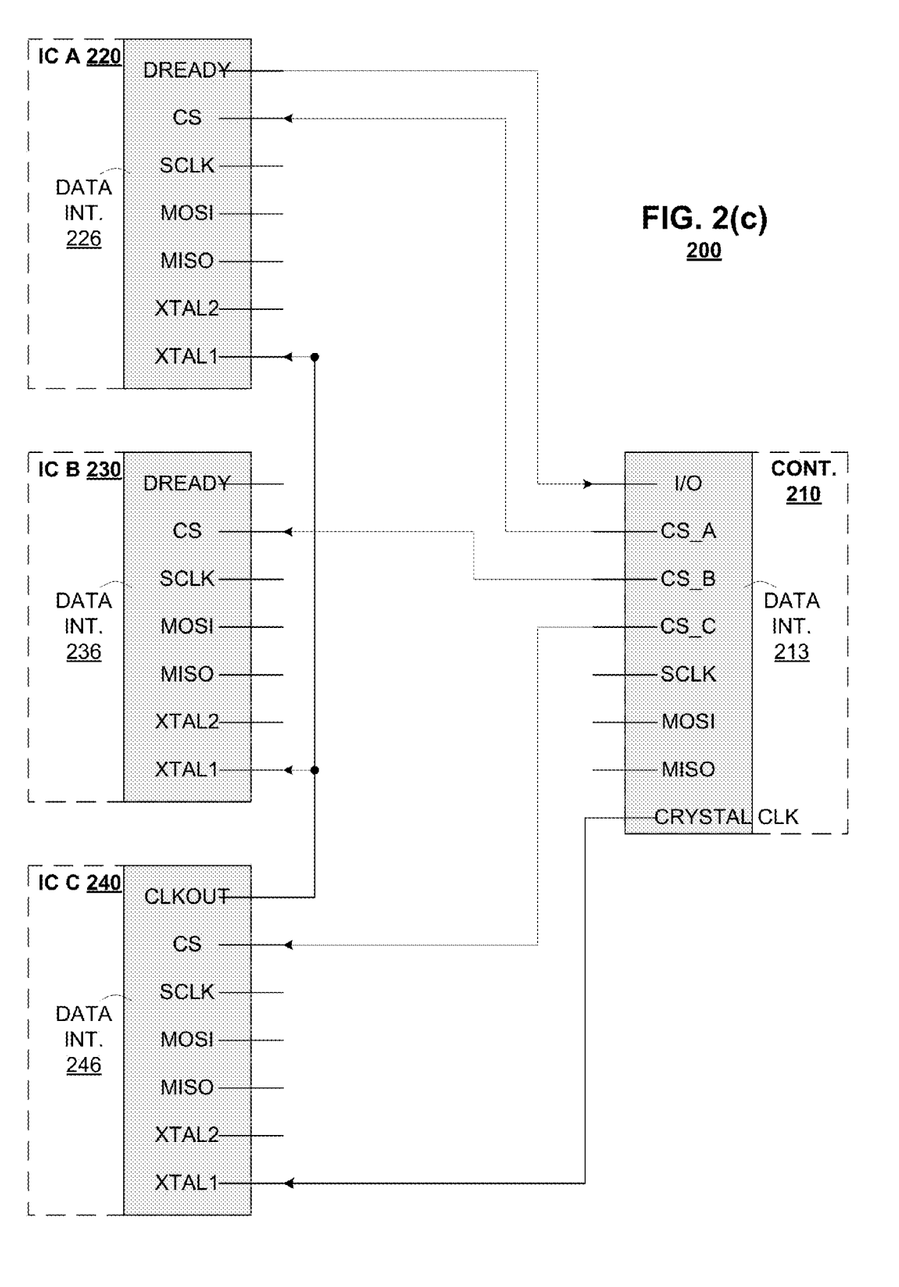
Figure 2D:
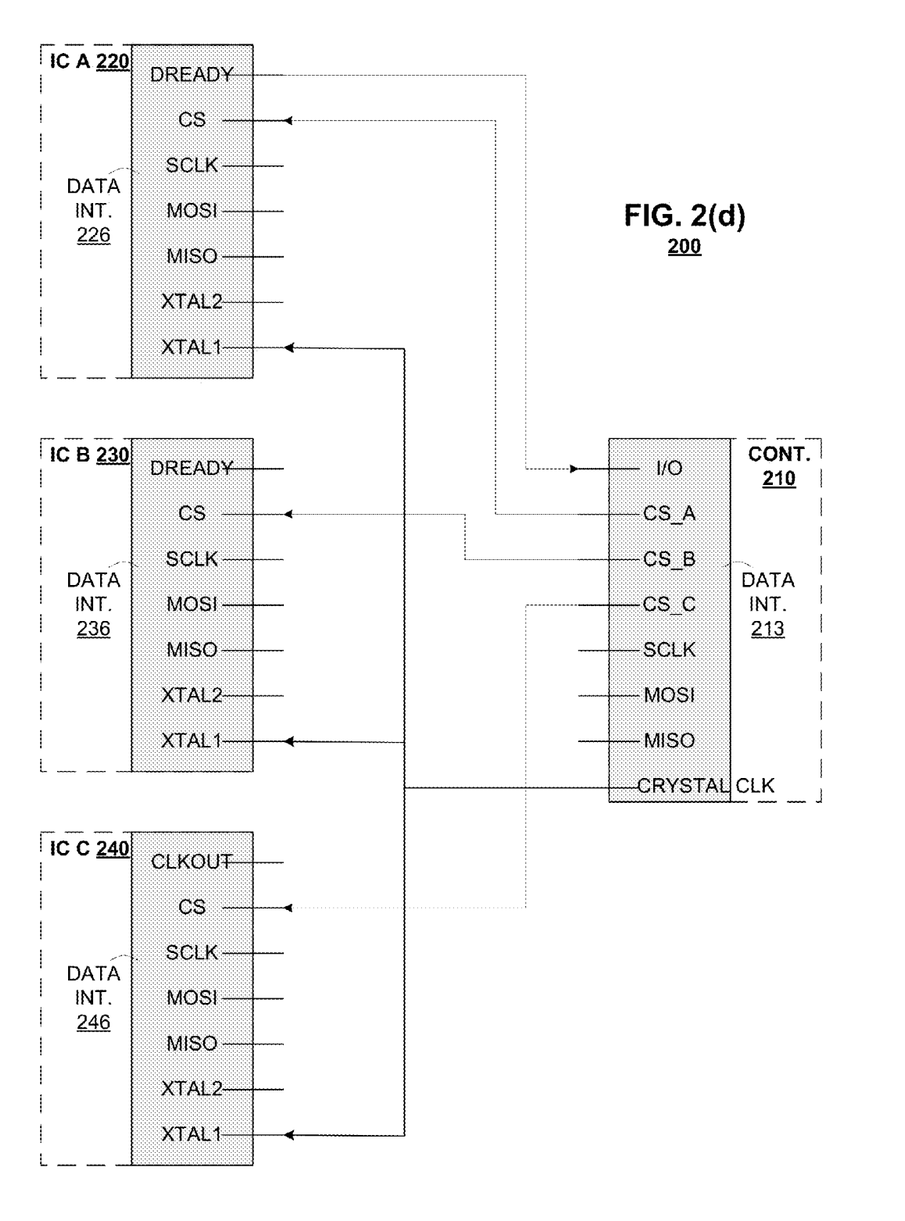

The crystal clock 250 may be coupled to the XTAL1 and XTAL2 (Crystal) pins of IC C's data interface 246. IC C may provide the crystal clock signal to the other IC's (to their XTAL1 pins) via its CLKOUT pin. Alternatively, the controller 210 may provide a crystal clock signal to the ICs 220, 230, 240 via their XTAL1 pins. FIG. 2(c) shows an embodiment where the controller 210 may provide the crystal clock signal according to an embodiment of the present invention. In FIG. 2(c), the controller 210 may provide the crystal clock signal to IC C 240 via its XTAL1 pin. IC C may then provide the crystal clock signal to the other IC's (to their XTAL1 pins) via its CLKOUT pin. FIG. 2(d) shows another embodiment where the controller 210 may provide the crystal clock signal according to an embodiment of the present invention. In FIG. 2(d), the controller 210 may provide the crystal clock signal to all ICs 220, 230, 240 via their respective XTAL1 pins. Therefore, in FIGS. 2(c) and 2(d) embodiments, an external XTAL2 pin may be saved on each IC.

Referring to FIG. 2(b), the controller 210 may provide a serial clock signal to all the coupled ICs via the SCLK pins. The controller 210 may also transmit other signals (e.g., commands) to the ICs via the MOSI pins, which represents master output slave input. The controller signals on the MOSI signal line may be associated with CS pin selection(s) to address the signal to the target IC(s). For example, the controller 210 may select the target ICs for its signal via their respective CS pins and may transmit the command on the MOSI signal line. Only the target ICs whose CS pins were selected may decode the command on the MOSI line while the other ICs may ignore the command on the MOSI line. Conversely, the ICs may send signals to the controller via the MISO pins, which represents master input slave output.

Next, synchronization operations according to embodiments of the present invention are described. The synchronization operations may be performed between the controller and the coupled ICs via their respective data interfaces. Also, the synchronization operations may be performed without a designated synchronization pin but via common data pin(s) in the data interfaces as described below.

Figure 3:
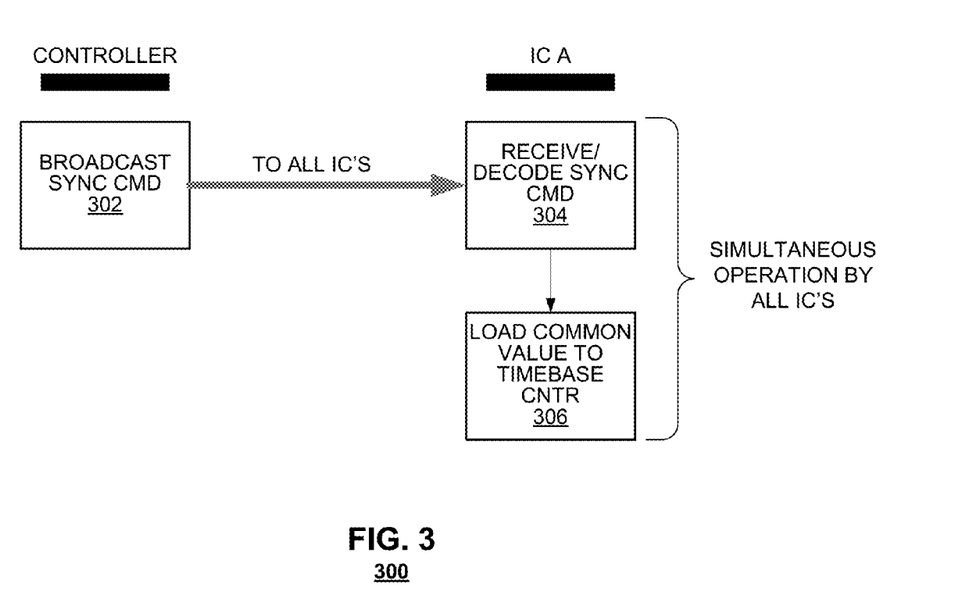
FIG. 3 is a simplified flow diagram of an initial synchronization process according to an embodiment of the present invention.

FIG. 3 illustrates a simplified flow diagram of an initial synchronization process 300 between a controller and ICs. Only one IC is shown in the flow diagram for simplicity. In step 302, the controller may broadcast a SYNC command to all coupled ICs. In step 304, the IC (all ICs) may receive and decode the SYNC command. In an embodiment, the controller may broadcast the SYNC command by selecting all the coupled ICs via their CS pins (e.g., pulling all CS lines low), and transmitting the SYNC command on the MOSI line. Thus, all the coupled ICs may receive and decode the SYNC command since their CS pins are selected.

In step 306, responsive to the SYNC command, the IC may load a common value to its timebase counter. The common value may be pre-programmed such as a default value or may be sent by the controller. The timebase counter may then operate based on the loaded common value. In an embodiment, the timebase counter may count down from the common value to zero for each cycle. Other counter operations based on the common value may also be implemented. Steps 302 and 304 may be performed simultaneously by all couple ICs. Therefore, all ICs may be synchronized and produce coherent samples. Also, in an embodiment, the ICs may only be temporarily disrupted from their respective operations (e.g., converter sampling) during the timebase counter loading.

Although the initial synchronization process may synchronize the ICs, the ICs may falter and fall out of sync during operations due to external system events. For example, interference in the form of ESD, EFD, RF, and/or power surges may cause disruption in IC operations.

Figure 4A:
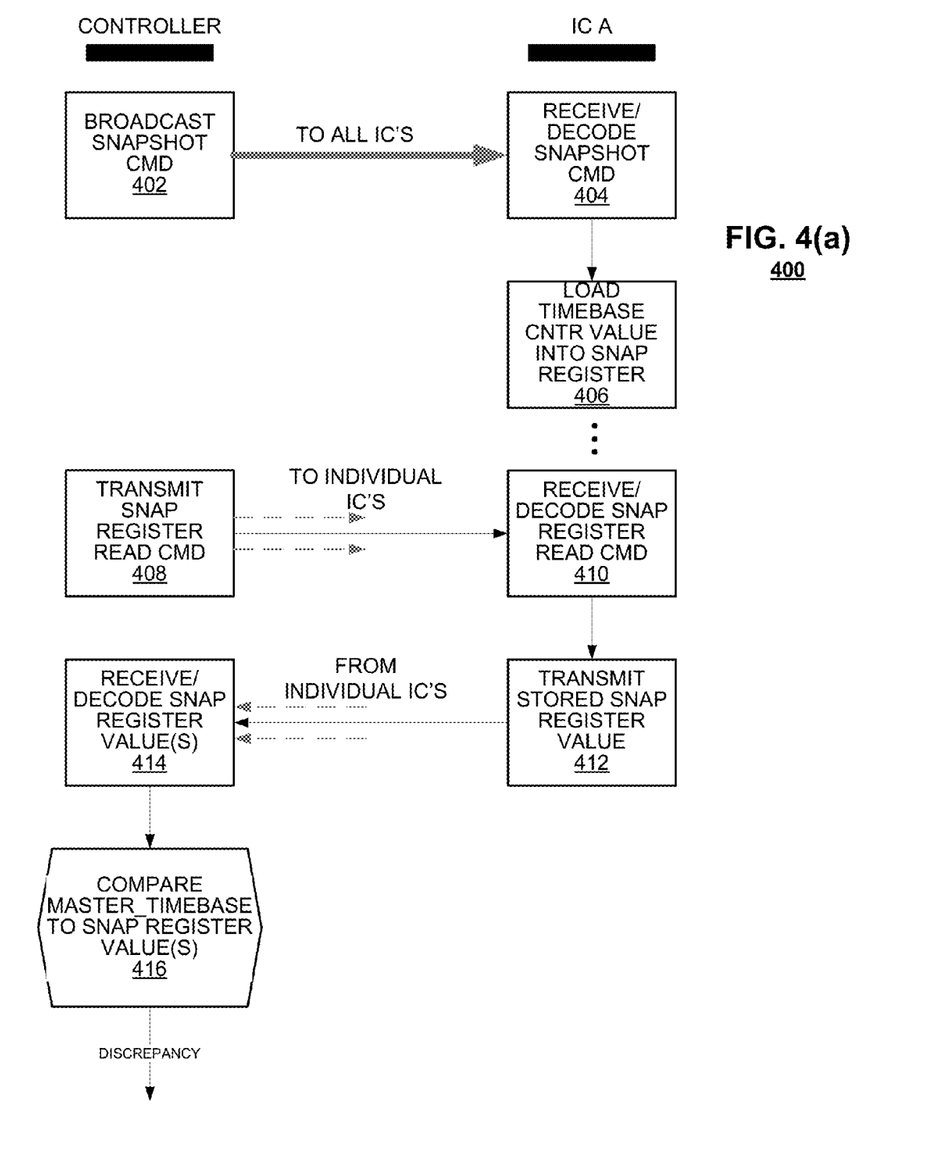
FIGS. 4(a)-(b) is a simplified flow diagram of a re-synchronization process according to an embodiment of the present invention.
Figure 4B:
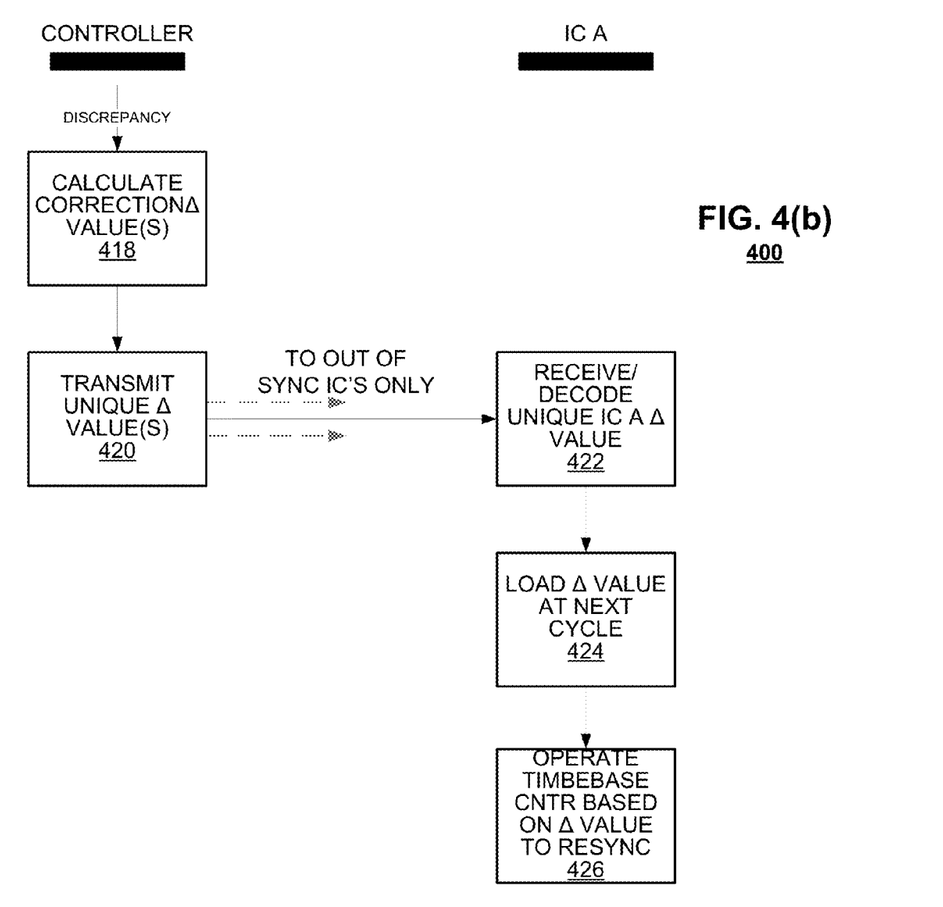

FIGS. 4(a) and 4(b) illustrate a simplified flow diagram of a re-synchronization process 400 between a controller and ICs. Only one IC is shown in the flow diagram for simplicity. In an embodiment, the re-synchronization process 400 may be performed at any time after the above described initial synchronization process 300. Alternatively, the re-synchronization process 400 may be performed without a preceding initial synchronization process 300 performance.

In step 402, the controller may broadcast a SNAPSHOT command to all coupled ICs. In step 404, the IC (all ICs) may receive and decode the SNAPSHOT command. In an embodiment, the controller may broadcast the SNAPSHOT command by selecting all the coupled ICs via their CS pins (e.g., pulling all CS lines low), and transmitting the SNAPSHOT command on the MOSI line. Thus, all the coupled ICs may receive and decode the SNAPSHOT command since their CS pins are selected. In step 406, responsive to the SNAPSHOT command, the IC may load its current timebase counter value into a snap register that can be read by the controller. Steps 404 and 406 may be performed simultaneously by all couple ICs. Therefore, the snap register values of all coupled ICs may be loaded with their timebase counter value at substantially the same time. Moreover, the controller may save its current master_timebase value at the time of the SNAPSHOT command in a register file.

In step 408, the controller may transmit a snap register read command. The controller may transmit the snap register read command to individual ICs and may also transmit the snap register read command to individual ICs at different times. In an embodiment, the controller may schedule the snap register read command transmission based on the controller workload and/or sampling results from the ICs. In step 410, the IC may receive and decode the snap read command. In an embodiment, the controller may transmit the snap register read command to all ICs but at different times by targeting the ICs one at a time. For example, the controller may select the target IC via its respective CS pin and may transmit the snap register read command on the MOSI line. Thus, only the target IC may decode and read the snap register command on its MOSI pin.

In step 410, the target IC may transmit its stored snap register value to the controller responsive to the snap register read command. In an embodiment, the target IC may transmit its snap register value on the MISO line. Next, the controller may receive and decode the snap register value from the target IC. The controller may save the snap register value in a register file. In an embodiment, steps 408-414 may be performed for coupled ICs.

In step 416, the controller may compare its master_timebase value, which was stored at the time of the SNAPSHOT command transmission, and the received snap register value(s). A discrepancy between the two values may indicate an out of sync IC. If there are no discrepancies, no re-synchronization may be performed. However, if there are any discrepancies between the master_timebase value and any received snap register value(s), the out of sync may be identified and a correction Δ value for each out of sync IC may be calculated in step 418. The Δ value may be unique to the out of sync IC and, therefore, a Δ value may be calculated for each detected out of sync IC.

The Δ value may be a correctional offset value to readjust the IC counter to re-synchronize with the controller master-timebase value. In an embodiment, the Δ value calculation may differ depending on if the out of sync IC register snap value ($C_x$) is greater or less than the master_timebase value ($C_m$).

If the out of sync register snap value is greater than the master_timebase value, (i.e., $C_x > C_m$), then $$\Delta_x = C_m + C_o - C_x,$$

where $\Delta_x$ is the unique correction value for the specific out of sync IC x, $C_m$ is the master_timebase value, $C_o$ is the common value of the timebase counter, and $C_x$ is the received out of sync IC register snap value.

If, however, the out of sync register snap value is less than the master_timebase value, (i.e., $C_x < C_m$), then $$\Delta_x = C_m - C_x,$$

where $\Delta_x$ is the unique correction value for the specific out of sync IC x, $C_m$ is the master_timebase value, and $C_x$ is the received out of sync IC register snap value.

In step 420, the controller may transmit the unique correction Δ value to its target IC. Accordingly, the target IC may receive and decode its Δ value in step 422. In an embodiment, the controller may select the target IC via its respective CS pin and may transmit the target's Δ value on the MOSI line. Thus, only the target IC may decode and read its unique Δ value on its MOSI pin. All other ICs may ignore the unique correction Δ value transmission on the MOSI signal line. The controller may transmit unique Δ values to only out of sync ICs. If no discrepancy was detected in step 416 regarding an IC, the controller may not calculate and transmit a unique correction Δ value to that IC since that IC is in proper synchronization.

In an embodiment, the Δ value may be a 12-bit value written into each IC in two consecutive 8-bit writes to two 8-bit counter registers, counter0 and counter1 registers.

In step 424, the out of sync IC may load its unique correction Δ value into its timebase counter at the next available cycle. In an embodiment, the time base counter may operate the counter0 and counter1 registers at the next available cycle. Thus, at the next cycle, the timebase counter may operate based on the unique correction Δ value and not based on the common value in step 426. For example, the timebase counter may count down from the unique correction Δ value instead of the common value in the next cycle. Thus, the IC may be realigned at the conclusion of the counter's operation based on the unique correction Δ value, and the IC may load the common value again in its timebase counter at this time. Other counter operations based on the unique correction Δ value and the common value to re-synchronize the IC may also be implemented. Steps 422-226 may only be performed by the out of sync ICs and, therefore, the in sync IC operations may not be disrupted with these steps.

Figure 5:
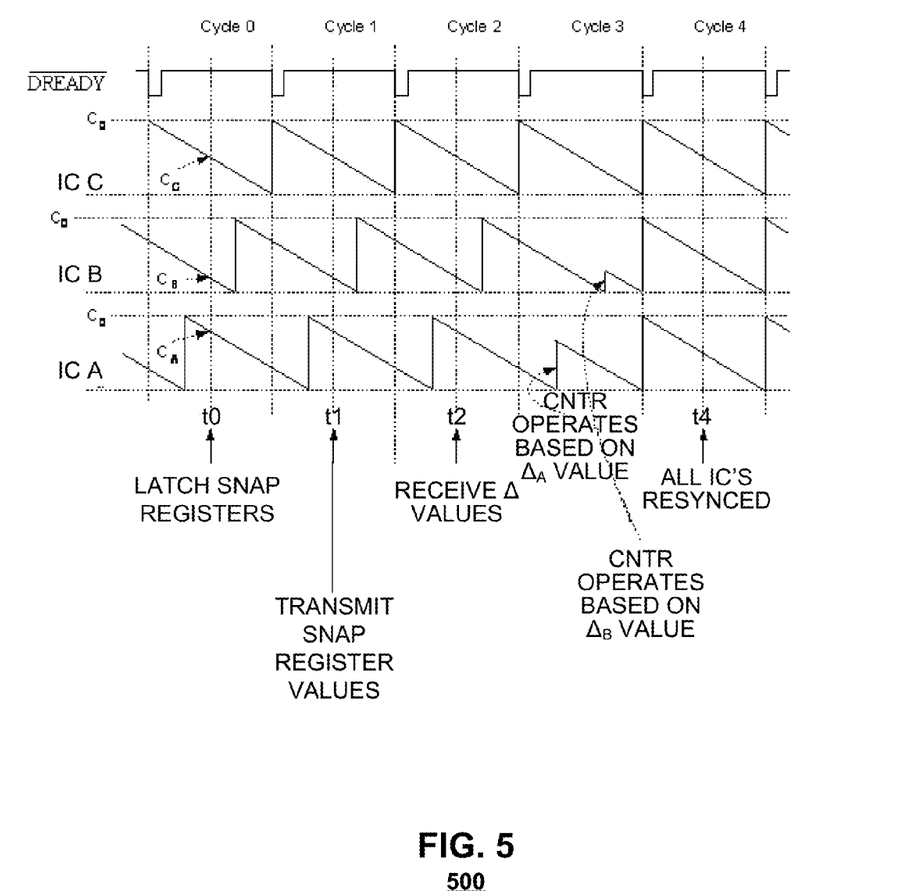
FIG. 5 is a timing diagram of a re-synchronization process according to an embodiment of the present invention.

FIG. 5 illustrates an exemplary timing diagram of the re-synchronization process 400 with respect to three ICs according to an embodiment of the present invention. The cycles illustrated may correspond to ADC cycles. At time t0 in cycle 0, the ICs may latch their snap register value ($C_x$) to their current time_base value (steps 404, 406). At time t1 in cycle 1, the ICs may transmit their respective snap register values to the controller (step 412). At time t2 in cycle 2, IC A and IC B may receive their unique correction Δ values. In this example, IC C may not receive a unique correction Δ value because it is in sync. Therefore, CC=Cm for this example.

As shown in FIG. 5, $C_A > C_c$ (Cm) and, therefore, $\Delta_A = C_c + C_o - C_x$. And as shown in FIG. 5, $C_B < C_c$ ($C_m$) and, therefore, $\Delta_B = C_c - C_x$. Thus, in cycle 3, the timebase counters in IC A and B operate based on their respective Δ values. For example, the timebase counters count down from their respective Δ values instead of the common value Co while IC C may continue to operate normally since it was not out of sync. By time t4 in cycle 4, all ICs may be re-synchronized and, consequently, may again be operating their timebase counters based on the common value.

Therefore, the re-synchronization process described herein may maintain synchronization efficiently and accurately. The re-synchronization process may also maintain synchronization without a designated common time-based signal and corresponding designated pin(s) on each IC. Furthermore, the re-synchronization process may only disrupt the out of sync IC(s) for its re-synchronization steps and allow the in sync IC(s) to continue their operations without unnecessary disruption (e.g., ADC sampling) and, thus, increase productivity.

Figure 6:
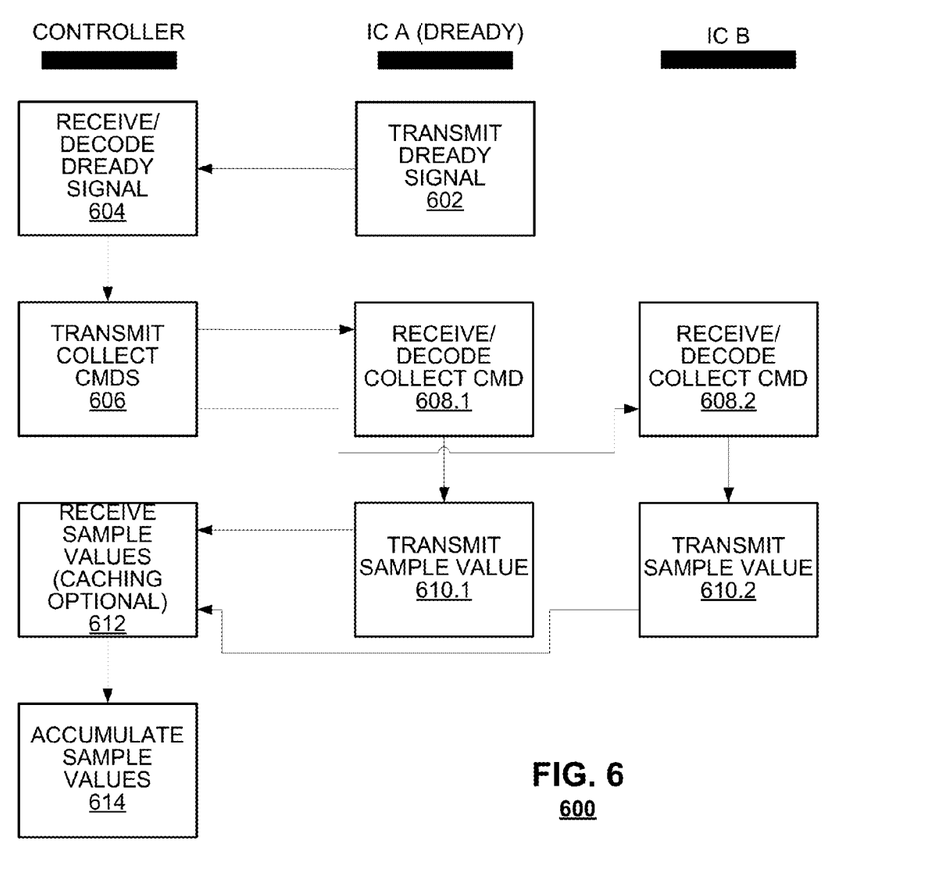
FIG. 6 is a simplified flow diagram of a data collection process according to an embodiment of the present invention.

FIG. 6 illustrates a simplified flow diagram of a data collection process 600 between a controller and ICs. Initially, one IC (say, IC A) may be designated as a signaling IC. When data is ready to be collected from IC A, IC A may transmit a DREADY signal to the controller in step 602. The DREADY signal may be an interrupt signal that indicates to the controller that data is ready to be collected from the ICs. In step 604, the controller may receive and decode the DREADY interrupt signal.

Based on the interrupt signal, the controller may initiate data collection from all ICs. Although only one IC (say, IC A) signalled that its respective data is ready to be collected, the controller may presume that all data is ready to be collected from all ICs. In particular, if the ICs are synchronized using the synchronization processes described herein, all ICs data should be ready for collection at the same time. Thus, only one IC may signal to the controller that the data is ready for collection from all ICs.

In step 606, the controller may transmit collect commands to the ICs. In steps 608.1, 608.2, the ICs, including IC A that sent the interrupt signal and the other ICs, may receive and decode the collect command. The controller may transmit the collect command to each IC individually or may broadcast the collect command. If transmitting the collect command individually, the controller, for example, may select the target IC via its respective CS pin and may transmit the collect command on the MOSI line. Thus, only the target IC may decode and read the collect command on its MOSI pin.

In steps 610.1, 610.2, the ICs may transmit their sample values to the controller in response to the received collect command. In step 612, the controller 612 may receive the sample values (data) from the ICs. In an embodiment, the controller may cache the received sample values. In step 614, the controller may accumulate the received sample values for further processing.

Figure 7:
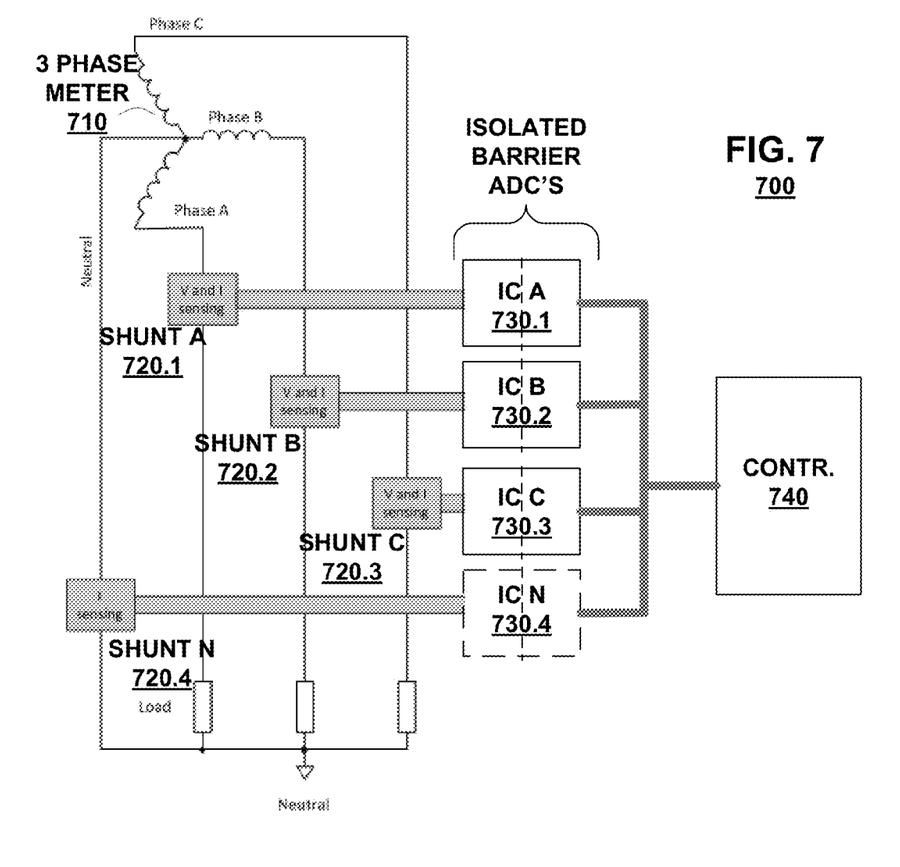
FIG. 7 is a simplified block diagram of a poly-phase measurement system according to an embodiment of the present invention.

Synchronization techniques including systems and/or operations described herein may have a variety of applications. In an embodiment, synchronization techniques described herein may be implemented in a poly-phase measurement system. FIG. 7 is a simplified block diagram of a poly-phase measurement system 700 with integrated synchronization according to an embodiment of the present invention. The system 700 may include a 3 phase meter, 710, shunts 720.1-720.4, isolated barrier ICs 730.1-730.4 (ADCs), and a controller 740.

The shunts 720.1-720.4 may be coupled to different phase branches (phase A, B, C and neutral) of the 3 phase meter 710 and may sense voltage and/or current from their coupled phase branches. The shunts 720.1-720.4 may also be coupled to ICs 730.1-730.4. The ICs 730.1-730.4 may include an isolated barrier and may be provided as other IC embodiments described herein. The controller 740 may be coupled to the ICS 730.1-730.4. The system 700 may also include a crystal clock (not shown). Moreover, the controller 740 and ICs 730.1-730.4 may be provided and may employ synchronization techniques as described herein in various embodiments of the present invention.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

Some embodiments may be implemented, for example, using a computer-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The computer-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disc Read Only Memory (CD-ROM), Compact Disc Recordable (CD-R), Compact Disc Rewriteable (CD-RW), optical disk, magnetic media, magneto-optical media, removable memory cards or disks, various types of Digital Versatile Disc (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

We claim:

1. A system, comprising:
   a controller to control synchronization operations of the system, the controller comprises a master timing counter and a controller data interface; and
   a plurality of integrated circuits, each integrated circuit to perform signal conversion and comprises a timing counter and an integrated circuit (IC) data interface that includes a plurality of pins, wherein a subset of the IC data interface pins is used for communicating signal conversion data to the controller, and each integrated circuit to synchronize its respective timing counter based on a synchronization command received from the controller via its subset of IC data interface pins for communicating signal conversion data,
   wherein based on values received from the plurality of integrated circuits, the controller to determine if each of the plurality of integrated circuits are out of sync, for all out of sync converters, to calculate a unique offset correction value, and to transmit the unique correction values to the out of sync converters.

2. The system of claim 1, further comprising a crystal clock to provide a common clock signal to the plurality of integrated circuits.

3. The system of claim 1, wherein each integrated circuit comprises an analog-to-digital signal converter.

4. The system of claim 1, based on an interrupt signal from one of the plurality of integrated circuits, the controller to collect data from all of the plurality of integrated circuits.

5. The system of claim 1, wherein the system is a polyphase measurement system and each integrated circuit is an isolated barrier analog to digital converter.

6. A synchronization method between a master controller and a plurality of slave integrated circuits, comprising:
   transmitting a first command to the integrated circuits, the first command being associated with a timing counter value via a subset of controller data interface pins that is used for communication of signal conversion data between the controller and the plurality of slave integrated circuits;
   receiving timing counter values from the integrated circuits;
   comparing the timing counter values to a stored reference value to determine whether each integrated circuit is in sync or out of sync; and
   for each integrated circuit determined to be out of sync, calculating a correction offset value unique to that integrated circuit and transmitting the correction offset value to the out of sync integrated circuit.

7. The synchronization method of claim 6, further comprising before transmitting the first command, transmitting an initial synchronization command to the integrated circuits for each integrated circuit to load a common value to their timing counters.

8. The synchronization method of claim 6, wherein the correction offset value correction depends on whether the timing counter value is greater or less than the stored reference value.

9. The synchronization method of claim 6, further comprising
   receiving an interrupt signal from one integrated circuit;
   based on the interrupt signal, collecting data from all integrated circuits.

10. A synchronization method for a slave integrated circuit, comprising:
    responsive to a first command received from a master controller via a subset of data interface pins used for communicating signal conversion data to the master controller, storing a current timing counter value from a timing counter to a register;
    transmitting the timing counter value to the master controller;
    receiving a correction offset value from the master controller via the subset of data interface pins;
    in a next operation cycle, operating the timing counter based on the correction offset value; and
    after operating the timing counter based on the correction offset value to synchronize with the master controller, return to operating the timing counter based on a common value.

11. The synchronization method of claim 10, further comprising
    prior to the first command, receiving a broadcast sync command from the master controller, and
    responsive to the broadcast sync command, loading the common value to the timing counter; and
    operating the timing counter based on the common value.

12. A controller, comprising:
    a register to store a master time value;
    a data interface including a plurality of data interface pins to communicate with multiple slave units; and
    a processor to:
      based on received slave unit counter values via a subset of data interface pins that is used for communicating signal conversion data from the slave units to the controller, determining if each slave unit is in sync or out of sync by comparing the counter values to the master time value; and
      for each out of sync slave unit, calculating an offset correction value based on that slave unit's counter value and transmitting the offset correction value to that slave unit.

13. The controller of claim 12, wherein the processor to transmit an initial synchronization command to the multiple slave units.

14. The controller of claim 12, wherein data interface is a serial peripheral interface.

15. The controller of claim 12, wherein responsive to an interrupt signal from a single slave unit, the processor to collect data from all slave units.

* * * * *